(12) United States Patent
Stier et al.

(10) Patent No.: US 7,564,175 B2
(45) Date of Patent: Jul. 21, 2009

(54) TUBULAR SPRING FOR ACTUATOR, AND METHOD FOR ASSEMBLING THE TUBULAR SPRING

(75) Inventors: Hubert Stier, Vaihingen/Enz (DE); Dietmar Schmieder, Markgroeningen (DE); Rene Deponte, Weil Im Schoenbuch (DE)

(73) Assignee: Robert Bosch GmbH, Stuttgart (DE)

( * ) Notice: Subject to any disclaimer, the term of this patent is extended or adjusted under 35 U.S.C. 154(b) by 372 days.

(21) Appl. No.: 10/558,812

(22) PCT Filed: Apr. 6, 2005

(86) PCT No.: PCT/DE2004/000712

§ 371 (c)(1),
(2), (4) Date: Dec. 5, 2006

(87) PCT Pub. No.: WO2004/109818

PCT Pub. Date: Dec. 16, 2004

(65) Prior Publication Data

US 2007/0096375 A1 May 3, 2007

(30) Foreign Application Priority Data

Jun. 4, 2003 (DE) ................. 103 25 283
Mar. 9, 2004 (DE) .......... 10 2004 011 455

(51) Int. Cl.
*H01L 41/02* (2006.01)
*H01L 41/12* (2006.01)
(52) U.S. Cl. .......... 310/348; 310/26; 310/311

(58) Field of Classification Search .......... 310/26, 310/311, 328, 348
See application file for complete search history.

(56) References Cited

U.S. PATENT DOCUMENTS

| 7,514,847 | B2 * | 4/2009 | Dick et al. | .......... 310/328 |
| 2007/0252474 | A1 * | 11/2007 | D'Arrigo | .......... 310/311 |

FOREIGN PATENT DOCUMENTS

| CH | 434 802 | 4/1967 |
| DE | 196 50 900 | 6/1998 |
| DE | 19744235 | 4/1999 |
| DE | 19818068 | 10/1999 |
| DE | 19854508 | 5/2000 |
| DE | 19914411 | 10/2000 |
| DE | 19928780 | 1/2001 |
| DE | 199 51 012 | 4/2001 |
| DE | 100 35 168 | 2/2002 |
| DE | 10053928 | 5/2002 |
| DE | 10140196 | 3/2003 |
| DE | 10140197 | 3/2003 |
| DE | 10149915 | 4/2003 |
| DE | 10251225 | 5/2004 |
| DE | 103 10 787 | 9/2004 |
| DE | 19905726 | 8/2008 |
| JP | 2001512911 | 8/2001 |
| WO | WO 99/08330 | 2/1999 |
| WO | WO 02/079636 | 10/2002 |

* cited by examiner

*Primary Examiner*—Thomas M Dougherty
(74) *Attorney, Agent, or Firm*—Kenyon & Kenyon LLP

(57) ABSTRACT

A tubular spring is provided for preloading a piezoelectric or magnetostrictive actuator for the actuation of fuel injection valves for fuel injection systems of internal combustion engines. The tubular spring has at least two assembly engagements for uniform preloading of the tubular spring.

12 Claims, 5 Drawing Sheets

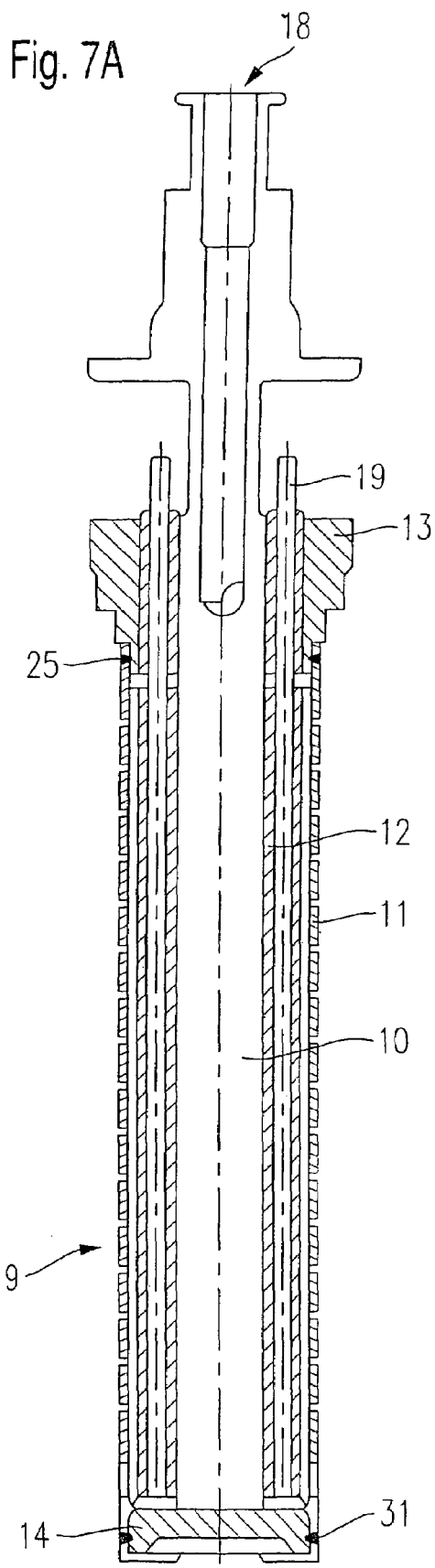
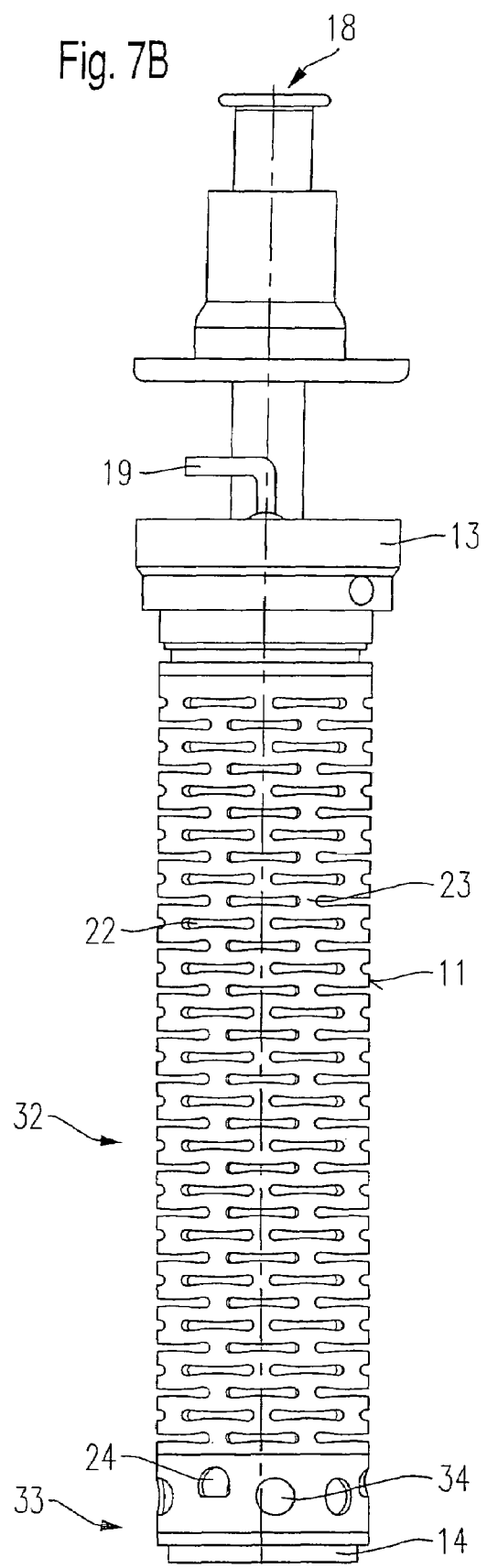

TUBULAR SPRING FOR ACTUATOR, AND METHOD FOR ASSEMBLING THE TUBULAR SPRING

FIELD OF THE INVENTION

The present invention relates to a tubular spring for an actuator and a method for assembling the tubular spring.

BACKGROUND INFORMATION

Piezoelectric or magnetostrictive actuators for the actuation of fuel injection valves for fuel injection systems of internal combustion engines are usually preloaded by way of a spring in order to eliminate tensile and shear forces. The residual load of the fuel injection valve's return spring, present even when the fuel injection valve is closed, is usually used to generate the preload.

An actuator, e.g., for the actuation of fuel injection valves for fuel injection systems of internal combustion engines, that has multiple layers made of a piezoelectric or magnetostrictive material arranged in stacked fashion, is described in published German patent document DE 199 51 012. The actuator is preloaded by way of a tie rod disposed in a central recess, by an opposite-direction thread. Immobilization and energy transfer are accomplished via a cover plate and a base plate.

This configuration is disadvantageous in particular because of the need to configure the stacked actuator in hollow fashion so that the tie rod can be accommodated in the recess. This makes the actuator even more susceptible to damage during preassembly and assembly.

Described in published international patent document WO 99/08330, is a piezoelectric actuator that is slid into a spring sleeve and joined, in preloaded and in frictionally or positively engaged fashion, to two ends of the spring sleeve. The result is to produce a basic unit in which the preload force of the piezoelectric actuator is permanently defined.

The particular disadvantage of this actuator is that the preload of the actuator is defined solely by the elasticity of the spring sleeve. Progressive characteristics in order to compensate for short activation times cannot thereby be achieved.

SUMMARY

The tubular spring according to the present invention for an actuator, and the method according to the present invention for assembly, have the advantage that assembly engagements in the tubular spring make possible uniform preloading of the tubular spring and of the actuator, and stress-free welding of the tubular spring to the actuator head and actuator foot.

Advantageously, the assembly engagements are disposed in at least one of the otherwise continuous end regions of the tubular spring. The result, on the one hand, is that the spring characteristics of the tubular spring are not negatively influenced. A positive influence, with a longer possible actuator stroke, is possible as a result of introduction of the assembly engagements in only one end region.

It is additionally advantageous that the assembly engagements are disposed on the tubular spring symmetrically and in paired fashion, or equidistantly at identical angular spacings, so that uniform loading is possible.

It is furthermore advantageous that a preassembly of the actuator module in the load-free state is first performed before the actuator module is inserted into an assembly apparatus for preloading and final assembly. As a result, the actuator is already protected from damage due to shear forces, and can be stored and transported until further processed.

BRIEF DESCRIPTION OF THE DRAWINGS

FIGS. 7A and 7B depict, in a sectional view and a side view, respectively, the completely assembled tubular spring configured according to the present invention as shown in FIGS. 5 and 6.

DETAILED DESCRIPTION

Figure 1:
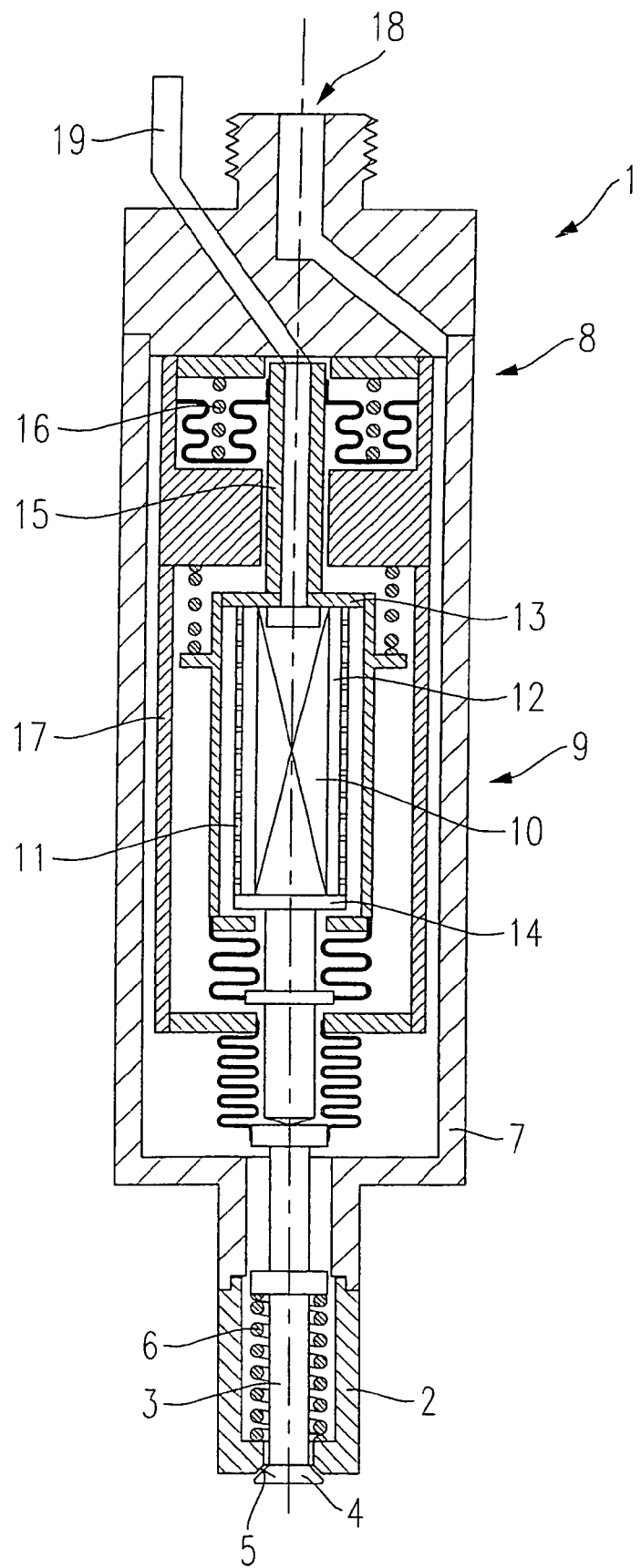
FIG. 1 is a schematic cross-sectional view of a fuel injection valve suitable for being fitted with a tubular spring according to the present invention.

FIG. 1 shows, in a highly schematic depiction, a fuel injection valve suitable for being fitted with a tubular spring configured according to the present invention.

Fuel injection valve 1 depicted in FIG. 1 is suitable, in particular, as a fuel injection valve 1 for direct injection of fuel into a combustion chamber (not depicted further) of an internal combustion engine.

Fuel injection valve 1 encompasses a nozzle body 2 in which a valve needle 3 is guided. The latter has at one outflow end a valve closure element 4 that forms a sealing fit with a valve seat surface 5. Fuel injection valve 1 is embodied as an outward-opening fuel injection valve 1. A return spring 6, disposed in nozzle body 2, impinges upon valve needle 3 in such a way that fuel injection valve 1 is held closed in the idle phase, and valve needle 3 is returned back to its idle position after the opening phase.

Nozzle body 2 opens into a housing 7 in which a hydraulic coupler 8 and an actuator module 9 are disposed.

Actuator module 9 encompasses a piezoelectric stacked actuator 10 that, for protection against shear forces, is preloaded with a tubular spring 11 configured according to the present invention. In a present example embodiment, actuator 10 is additionally protected by an injection-molded sheath 12. Actuator 10 has an actuator foot 13 and an actuator head 14 which are, for example, welded to tubular spring 11. Tubular spring 11 and the components of actuator 10 are described in more detail below with reference to FIGS. 2 through 4.

Hydraulic coupler 8, which is disposed on the inflow side of actuator module 9, encompasses a working piston 15 that is preloaded by a coupler spring 16 with respect to housing 7. Hydraulic coupler 8 converts the short stroke of piezoelectric actuator 10 into a longer stroke of valve needle 3.

Coupler 8 and actuator module 9 are encapsulated in an actuator housing 17. Flowing around the latter is the fuel, delivered centrally via an inflow fitting 18, that flows through housing 7 and through nozzle body 2 to the sealing seat. Fuel injection valve 1 is actuatable via an electrical plug contact 19.

In order to ensure, during the assembly and operation of actuator 10, that shear forces which may result in damage to actuator 10 are prevented, actuator 10 is encapsulated in tubular spring 11. The latter preloads actuator 10 so that it is stabilized by the exclusively axial forces acting on it.

Figure 2:
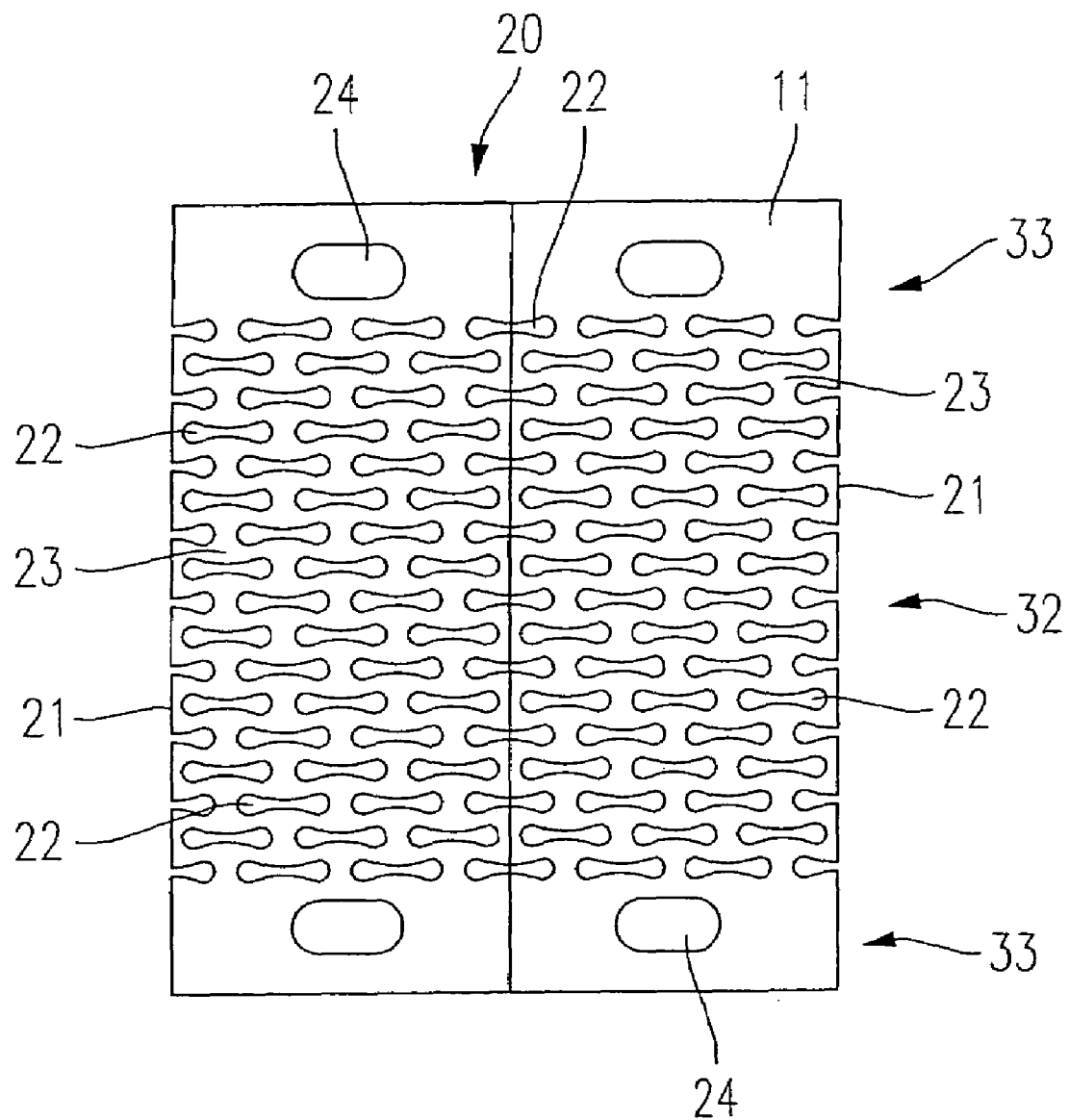
FIG. 2 is a plan view of a sheet-metal blank for manufacture of the tubular spring, according to a first example embodiment.
Figure 5:
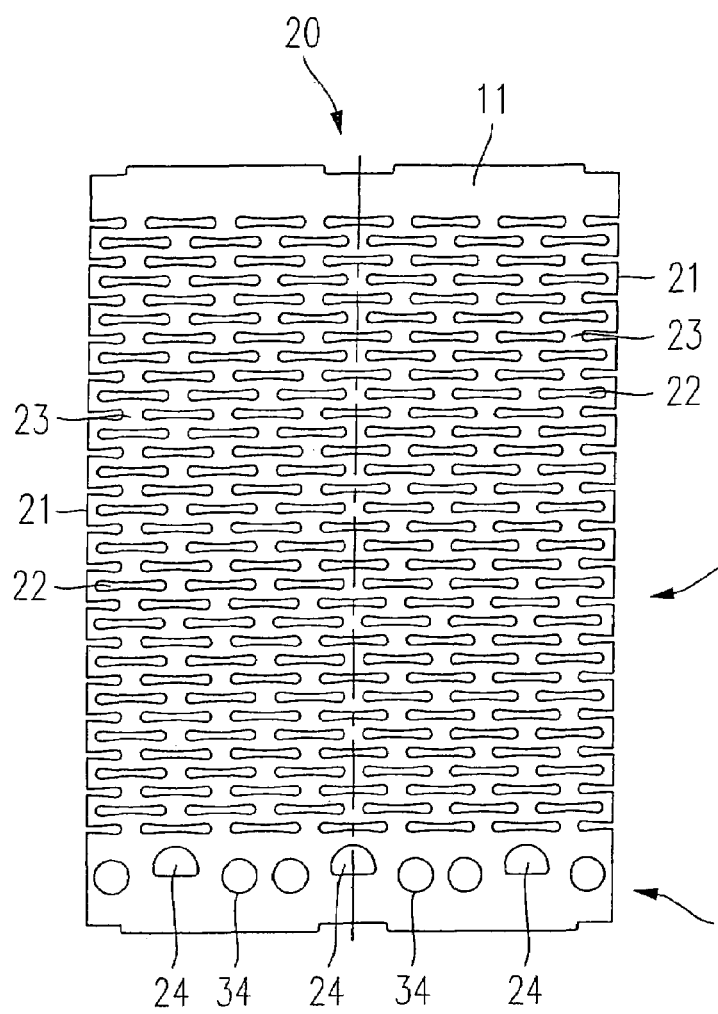
FIG. 5 is a plan view of a sheet-metal blank for manufacture of the tubular spring, according to a second example embodiment.
Figure 6:
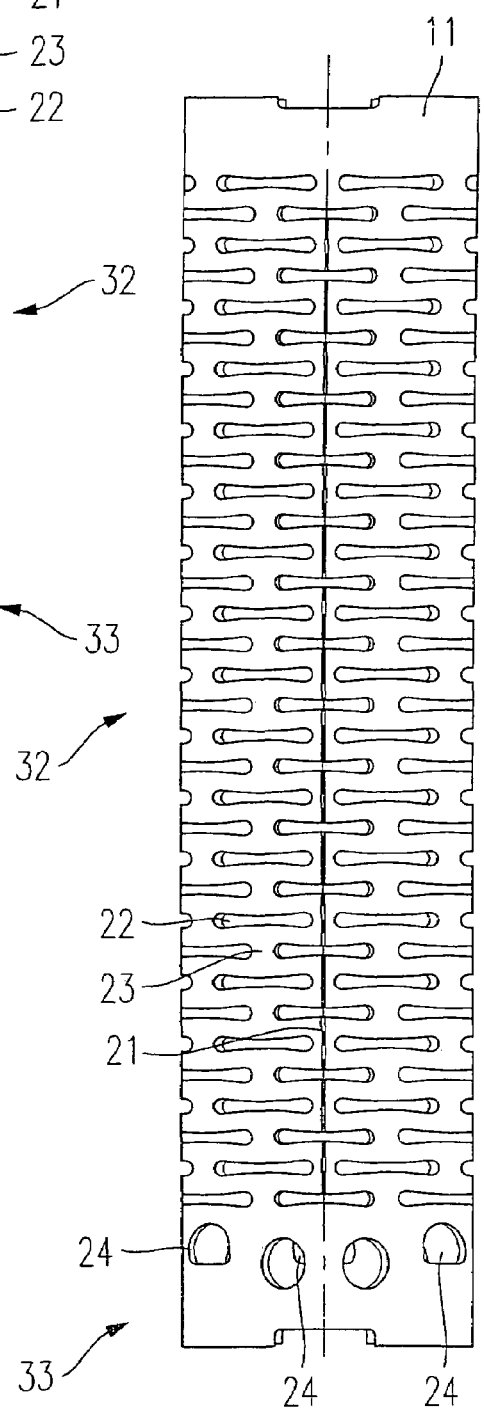
FIG. 6 is a side view of the rolled-up sheet-metal blank shown in FIG. 5, of the tubular spring configured according to the present invention.

Tubular spring 11 is manufactured in the manner depicted in FIGS. 2 and 5 for two different example embodiments, respectively. Firstly, a basic shape is produced by punching out of a sheet-metal blank 20, and is rolled up as depicted in FIG. 6 for the second example embodiment. In an abutting region in which edges 21 of tubular spring 11 are located next to one another, those edges are joined to one another by longitudinal welding so that a closed tube is created.

During manufacture of the basic shape, cutouts 22 are introduced into sheet-metal blank 20. Cutouts 22 are regularly distributed over a portion of the surface of tubular spring 11, cutouts 22 being embodied approximately in the shape of an "8". Cutouts 22 are produced by punching or similar methods. Webs 23 are left behind between cutouts 22 as a result of the machining process, and are responsible for the supporting and resilient action of tubular spring 11. As a result of the "8"-shape of cutouts 22, tubular spring 11 is flexible in terms of its axial extension: it can easily be extended or compressed. The spring constant of tubular spring 11 is influenced by the number, shape, size, and placement of cutouts 22.

According to the first example embodiment depicted in FIG. 2, cutouts 22 are embodied in a central region 32 of the tubular spring, whereas end regions 33 remain free of cutouts 22 and, aside from assembly engagements 24 described in more detail below, have a continuous surface. In the second example embodiment depicted in FIGS. 5 and 6, cutouts 22 are embodied both in central region 32 and in one of end regions 33.

Assembly engagements 24 that are required for the assembly of actuator 10 in tubular spring 11 are provided according to the present invention. In the first example embodiment depicted in FIG. 2, assembly engagements 24 are provided in both end regions 33 of tubular spring 11, whereas according to the second example embodiment depicted in FIGS. 5 and 6, assembly engagements 24 are embodied in only one of end regions 33. The region in which cutouts 22 are embodied is larger as a result, so that tubular spring 11 becomes more elastic.

As is apparent from the first example embodiment depicted in FIG. 2, for uniform force introduction, assembly engagements 24 are provided here at least in paired fashion opposite one another. In the second example embodiment depicted in FIGS. 5 and 6, on the other hand, at least three assembly engagements 24 are present, distributed equidistantly over the circumference of tubular spring 11 at identical angular spacings. Between assembly engagements 24, further cutouts 34 can be provided which, like the additional number of cutouts 22, make tubular spring 11 softer and thus enable a longer stroke for actuator 10. The function of assembly engagements 24 is explained in more detail in the description relating to FIGS. 3, 7A and 7B.

Figure 3:
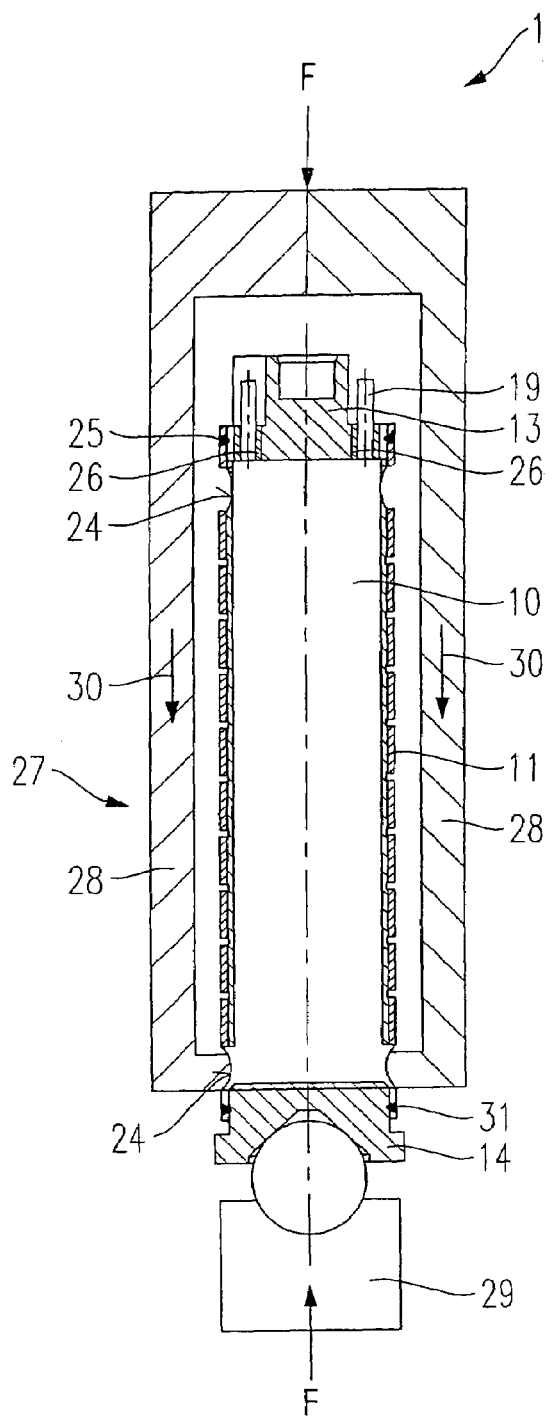
FIG. 3 is a schematic cross-sectional view illustrating the assembly of a tubular spring configured according to the present invention as shown in FIG. 2.

FIG. 3 depicts the assembly of actuator 10 in a tubular spring 11 shown in FIG. 2.

Actuator 10 is advantageously assembled in tubular spring 11 in such a way that a preload is generated in actuator module 9 by a controlled-force displacement. Despite production and stiffness tolerances, the preload force can be adjusted very accurately without the use of further components. The welding of actuator head 14 and actuator foot 13 to tubular spring 11 can be accomplished in a region unaffected by the preload force, so that the weld can be created in stress-free fashion and exhibits considerably better stability. This is made possible by the stiffness of tubular spring 11 in the region of assembly engagements 24.

Assembly is performed in the following sequence: First, tubular spring 11 is fitted onto actuator foot 13 and welded to it with a first weld seam 25. Then actuator 10 is inserted into tubular spring 11. While actuator 10 is held in contact against actuator foot 13, centering pins 26 are inserted between electrical lines 19 and tubular spring 11 in order to center actuator 10 in tubular spring 11. Actuator head 14 is then inserted, and slid into tubular spring 11 until it rests against actuator 10.

Actuator module 9 preassembled in this fashion is transportable without difficulty, since the sensitive actuator 10 is located in tubular spring 11 and protected from shear forces.

Actuator module 9 is inserted into an assembly device 27 that is depicted schematically in FIG. 3, and clamping jaws 28 engage into outflow-end assembly engagements 24 of tubular spring 11. A load cell 29 rests against actuator head 14.

Load cell 29 is first calibrated, and then clamping jaws 28 along with tubular spring 11 are displaced toward load cell 29, as indicated by arrows 30. The force F with which tubular spring 11 is pressed against actuator head 14 can be read off at any time directly from load cell 29. Tubular spring 11 can then be displaced until the desired preload on actuator 10 is achieved. The magnitude of the force is based on requirements regarding the stroke of actuator 10, and the desired activation characteristics. A progressive spring constant can also be attained with a suitable configuration of tubular spring 11.

Lastly, tubular spring 11 is welded to actuator head 14 via a second weld seam 31. The force path in tubular spring 11 is such that all components that are later to be under load are also stressed during preloading. Only end region 33 of tubular spring 11 in which assembly engagements 24 are embodied is not located in the force path, so that second weld seam 31 can be created in a stress-free state.

Figure 4:
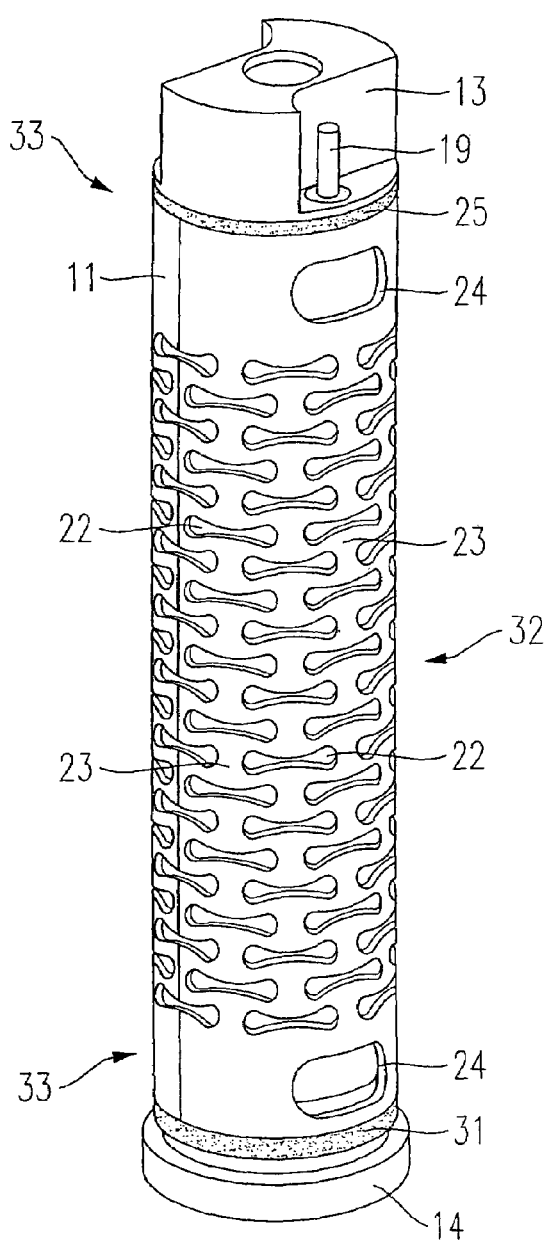
FIG. 4 is a perspective view of the completely assembled tubular spring configured according to the present invention as shown in FIGS. 2 and 3.

FIG. 4 shows the completely assembled actuator module 9. Tubular spring 11 is welded by way of weld seams 25 and 31 to actuator foot 13 and actuator head 14, respectively. Assembly engagements 24 are required only in end region 33 of tubular spring 11 located closer to actuator head 14, but may nevertheless be provided at both ends of tubular spring 11 as also depicted in FIGS. 2 and 3, both for reasons of symmetry in order to avoid any distortion of the spring characteristic and for cost reasons.

FIGS. 7A and 7B depict a completely assembled actuator module 9 having a tubular spring 11 as shown in FIG. 6, in a sectional view and a side view, respectively.

The assembly process for a tubular spring 11 according to the second example embodiment, depicted in FIGS. 5 through 7, encompasses the following assembly steps. First, actuator 10 is fitted onto a fuel inlet 18 joined to an actuator foot 13. Tubular spring 11 is then likewise fitted onto actuator foot 13, and joined to it in stress-free fashion via a first weld seam 25. Tubular spring 11 is then preloaded by tension on assembly engagements 24. Tubular spring 11 is first overextended beyond the necessary tensile force, and the tensile force is then reduced to the necessary tensile force of approximately 600 N.

Lastly, tubular spring 11 is welded to actuator head 14 via a second weld seam 31. The force path in tubular spring 11 is such that all components that are later to be under load are also stressed during preloading. Only end region 33 of tubular spring 11 in which assembly engagements 24 are embodied is not located in the force path, so that second weld seam 31 can be created in a stress-free state.

The present invention is not limited to the example embodiments depicted, and is applicable in particular to a plurality of fuel injection valve designs. All the features of the example embodiment may also be combined with one another.

What is claimed is:

1. A tubular spring for one of a piezoelectric actuator and a magnetostrictive actuator for actuation of a fuel injection valve of a fuel injection system, comprising:
 a tubular body, wherein the tubular body is in operative engagement with the one of the piezoelectric actuator and the magnetostrictive actuator, and wherein the tubular body has at least one assembly engagement in the form of a cut-out in an axial end region of the tubular body, and wherein the at least one assembly engagement enables uniform preloading of the tubular spring and the one of the piezoelectric actuator and the magnetostrictive actuator.

2. The tubular spring as recited in claim 1, wherein the tubular spring has, at least in a central region, cut-outs and webs located between the cut-outs.

3. The tubular spring as recited in claim 2, wherein at least one assembly engagement is provided at each axial end region of the tubular spring.

4. The tubular spring as recited in claim 2, wherein at least two assembly engagements are provided at each of the axial end regions.

5. The tubular spring as recited in claim 4, wherein at each axial end region of the tubular spring, the two assembly engagements are disposed radially opposite one another.

6. The tubular spring as recited in claim 2, wherein the at least one assembly engagement is only provided at a first axial end region of the tubular spring.

7. The tubular spring as recited in claim 6, wherein a second axial end region of the tubular spring is provided with cut-outs and webs located between the cut-outs.

8. The tubular spring as recited in claim 6, wherein at least three assembly engagements are provided at the first axial end region of the tubular spring.

9. The tubular spring as recited in claim 8, wherein the at least three assembly engagements are separated by a regular annular spacing.

10. The tubular spring as recited in claim 9, wherein additional cut-outs are provided between the assembly engagements.

11. The tubular spring as recited in claim 2, wherein the tubular spring is connected to an actuator head and to an actuator foot of the one of the piezoelectric actuator and the magnetostrictive actuator.

12. The tubular spring as recited in claim 11, wherein connections to the actuator head and to the actuator foot are achieved by weld seams.

* * * * *